United States Patent
Tsai et al.

(10) Patent No.: US 7,226,875 B2
(45) Date of Patent: Jun. 5, 2007

(54) METHOD FOR ENHANCING FSG FILM STABILITY

(75) Inventors: Cheng-Yuan Tsai, Hsin-Chu (TW); You-Hua Chou, Taipei (TW); Chih-Lung Lin, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 357 days.

(21) Appl. No.: 10/999,547

(22) Filed: Nov. 30, 2004

(65) Prior Publication Data

US 2006/0115996 A1 Jun. 1, 2006

(51) Int. Cl.
*H01L 21/316* (2006.01)
*H01L 21/473* (2006.01)

(52) U.S. Cl. ............... 438/786; 438/624; 257/644; 257/E21.276

(58) Field of Classification Search .......... 438/624, 438/783, 786; 257/634, 635, 644, 650, E21.275, 257/21.276, 23.167
See application file for complete search history.

(56) References Cited

U.S. PATENT DOCUMENTS

| | | | | |
|---|---|---|---|---|
| 2,481,700 A | * | 9/1949 | Huggins et al. ............... 501/44 |
| 3,492,136 A | * | 1/1970 | Bromer et al. ................. 501/44 |
| 4,386,162 A | * | 5/1983 | Beall ............................. 501/3 |
| 5,360,637 A | * | 11/1994 | Jacoboni et al. ......... 427/255.17 |
| 5,454,847 A | * | 10/1995 | Jacoboni et al. ............. 65/386 |
| 5,643,640 A | * | 7/1997 | Chakravarti et al. ......... 427/578 |
| 5,827,785 A | * | 10/1998 | Bhan et al. ................... 438/784 |
| 6,008,120 A | * | 12/1999 | Lee ............................. 438/634 |
| 6,136,680 A | * | 10/2000 | Lai et al. ..................... 438/597 |
| 6,165,915 A | * | 12/2000 | Jang ............................ 438/787 |
| 6,180,540 B1 | * | 1/2001 | Jang ............................ 438/784 |
| 6,232,217 B1 | * | 5/2001 | Ang et al. .................... 438/624 |
| 6,271,146 B1 | * | 8/2001 | Ross ............................ 438/723 |
| 6,355,581 B1 | * | 3/2002 | Vassiliev et al. ............. 438/789 |
| 6,372,291 B1 | * | 4/2002 | Hua et al. ............... 427/255.28 |
| 6,511,922 B2 | * | 1/2003 | Krishnaraj et al. .......... 438/778 |
| 6,521,545 B1 | * | 2/2003 | Yang et al. .................. 438/763 |
| 6,541,400 B1 | * | 4/2003 | Tian et al. ................... 438/784 |
| 6,544,882 B1 | * | 4/2003 | Liu et al. ..................... 438/622 |
| 6,583,069 B1 | * | 6/2003 | Vassiliev et al. ............. 438/778 |
| 6,586,347 B1 | * | 7/2003 | Wang et al. ................. 438/778 |
| 6,633,076 B2 | * | 10/2003 | Krishnaraj et al. .......... 257/641 |
| 2001/0021591 A1 | * | 9/2001 | Srinivasan et al. .......... 438/783 |
| 2002/0133258 A1 | * | 9/2002 | Ngai et al. ................... 700/121 |
| 2005/0009045 A1 | * | 1/2005 | Greenfield et al. ............ 435/6 |
| 2005/0009367 A1 | * | 1/2005 | Cheng et al. ................ 438/783 |
| 2006/0017166 A1 | * | 1/2006 | Leu et al. .................... 257/758 |
| 2006/0141785 A1 | * | 6/2006 | Lee ............................. 438/687 |
| 2006/0148270 A1 | * | 7/2006 | Lu et al. ...................... 438/763 |

FOREIGN PATENT DOCUMENTS

| KR | 2002051287 A | * | 6/2002 |
|---|---|---|---|
| KR | 2005006499 A | * | 1/2005 |
| KR | 2005121382 A | * | 12/2005 |

* cited by examiner

*Primary Examiner*—M. Wilczewski
(74) *Attorney, Agent, or Firm*—Tung & Associates

(57) ABSTRACT

A method for enhancing stability of a fluorinated silicon glass layer is disclosed. A fluorinated silicon glass layer provided on a substrate is subjected to a phosphorous-containing and hydrogen-containing gas such as phosphine ($PH_3$), for example. The gas forms reactive hydrogen species which removes fluorine radicals and reactive phosphorous species which forms a moisture-gettering and ion-gettering phosphorious oxide film the layer.

23 Claims, 6 Drawing Sheets

METHOD FOR ENHANCING FSG FILM STABILITY

FIELD OF THE INVENTION

The present invention relates to intermetal dielectric (IMD) layers formed in the fabrication of semiconductor devices. More particularly, the present invention relates to a method for enhancing the stability of a fluorinated silicon glass (FSG) layer in semiconductor device fabrication by introducing a hydrogen-containing gas with an oxygen-containing gas into a process chamber immediately after the formation of the FSG layer in order to remove free fluorine radicals and reactive fluorine-based gases from the chamber.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

As integrated circuits decrease in size, delays associated with the wiring in the circuits have become increasingly important. To reduce such delays, it is necessary to reduce the resistance of the wires and/or the capacitance per unit length across the inter-metal dielectrics. Wire widths in integrated circuits have, however, continued to shrink such that the electrical conductivity of the wiring material itself has become increasingly more important. Therefore, aluminum is increasingly being replaced by copper.

Similarly, silicon dioxide, which has traditionally been the inter-metal dielectric (IMD) of choice in the semiconductor industry, is being increasingly replaced by dielectric materials having a lower dielectric constant. An example of a dielectric material with low dielectric constant in widespread usage is fluorinated silicon glass (FSG), which typically has a dielectric constant of below 3.9.

Integrated circuits having both copper wiring and FSG as the IMD layer are in widespread use. One of the problems associated with the use of copper in copper interconnect is the tendency of copper to diffuse quickly and serve as a source of recombination centers in silicon. Several materials are known to retard diffusion of copper at room temperature. However, these materials cannot be relied upon to serve as a barrier against copper diffusion when conventional multilayering is used due to the difficulty of using the materials to cover the edges of the wiring.

The wiring coverage problem has been solved using damascene wiring techniques. In a damascene wiring structure, rather than being covered by a supporting medium, a layer is inlaid within the medium. Therefore, instead of depositing an IMD layer and then fabricating the wiring structure on top of the IMD layer, a trench is first formed in the IMD layer after which the trench is filled with copper to form the copper wiring. The walls of the trench are lined with a barrier layer prior to deposition of the copper in the trench.

Referring to FIG. 1, a conventional damascene structure 10 includes a substrate 12 on which is typically provided a metal line 20. An FSG layer 14 is deposited as an intermetal dielectric (IMD) layer on the substrate 12 and metal line 20. A via opening 16 is etched through the FSG layer 14 to expose the surface of the metal line 20. A barrier layer 18 is deposited on the sidewalls and bottom of the via opening 16, after which a copper inlay 22 is deposited in the via opening 16, on the barrier layer 18 to form the copper wiring. The copper-filling step is carried out typically by over-filling the via opening 16 using electrochemical plating techniques, followed by removal of the copper overburden using chemical mechanical polishing (CMP).

The FSG layer 14 is formed on the substrate 12, typically, by reacting $SiF_4/SiH_4$ gas with oxidizer to form fluorinated silicate glass (F—SiO) in a chemical vapor deposition (CVD) chamber. Simultaneously, RF power is applied to the reactant gases to form a plasma in the chamber. After the main deposition step, ionized gases which contain various free radicals such as $SiF_3^*$, $SiF_2^*$, $SiF^*$, $Si^*$, $H^*$, $O^*$ and $F^*$, as well as unreacted $SiF_4$, all possibly remain in the chamber. These could have a tendency that contains Fluorine reactive gases and/or radical to chemically attack and/or to form the defects on the deposited FSG layer as well as subsequent processes, ex., forming the metal structures in devices being fabricated on the wafer, resulting in the instabilities in the devices.

Furthermore, during etching of the via opening 16 in the FSG layer 14, as well as during the post-filling CMP process, the FSG layer 14 is frequently exposed. Fluoride ions come from incomplete reaction and/or residual of F-containing gases during processing are loosely bound in the FSG layer 14. Consequently, highly-reactive fluorine radicals are released from the FSG layer 14. The fluorine radicals tend to react with the surface and sidewalls of the FSG layer 14, as well as with the copper inlay 22 (in the case of a CMP process) and moisture, resulting in outgassing, formation of defect structures in the FSG layer 14 and corrosion of the copper inlay 22.

Accordingly, an in-situ method is needed for eliminating the presence of fluorine and fluorine-containing radicals from a process chamber and an FSG layer after formation of the FSG layer on a substrate. Furthermore, an ex-situ method is needed for eliminating fluorine ions from an FSG layer after an etching process or a CMP process.

Accordingly, an object of the present invention is to provide a method for enhancing the stability of an FSG layer or film.

Another object of the present invention is to provide a method for preventing or reducing the incidence of radical-induced defects caused by damage to an FSG layer.

Still another object of the present invention is to provide an in-situ method for enhancing FSG film stability after formation of an FSG layer.

Yet another object of the present invention is to provide an ex-situ method for enhancing FSG film stability after an etching process or CMP process.

A still further object of the present invention is to provide a method for enhancing FSG layer stability, which method includes subjecting an FSG layer to $PH_3$ after formation of the FSG layer or after an etching or CMP process.

SUMMARY OF THE INVENTION

In accordance with these and other objects and advantages, the present invention is generally directed to a novel method for enhancing stability of an FSG layer. In one embodiment, the method is an in-situ method which is carried out typically in a CVD chamber after formation of the FSG layer on a substrate. The method includes depositing the FSG layer on the substrate and introducing a phosphorous and hydrogen-containing gas, preferably phosphine ($PH_3$), into the chamber. The phosphine dissociates into reactive hydrogen and phosphorous species. The reactive hydrogen species can scavenge fluoride radicals to produce hydrogen fluoride (HF) gas, which is evacuated from the chamber. The reactive phosphorous species react with oxygen to form a phosphorous oxide (PSG) film on the FSG layer. An oxide-like (PSG) film was, thus, formed on top of FSG and/or neighboring with the FSG on the trench sidewall would play a role of blocking layer to prevent fluorine outward diffusion. On the other hand, by gettering moisture and mobile ions in the chamber, the PSG film prevents fluoride-based radicals from attacking and damaging the FSG layer.

In another embodiment, the method is an ex-situ method for stabilizing an FSG layer after an etching process. The method includes providing an FSG layer on a substrate, etching a via opening in the FSG layer, and exposing the FSG layer to a phosphorous and hydrogen-containing gas, preferably $PH_3$, to form fluoride radical-removing hydrogen ions and a PSG film on the exposed FSG layer.

In still another embodiment, the method is an ex-situ method for stabilizing an FSG layer after a CMP process. The method includes providing a metal via in an FSG layer, subjecting the metal via to chemical mechanical planarization (CMP), and exposing the FSG layer to a phosphorous and hydrogen-containing gas, preferably $PH_3$, to form fluoride radical-removing hydrogen ions and a PSG film on the exposed FSG layer.

BRIEF DESCRIPTION OF THE DRAWINGS

The invention will now be described, by way of example, with reference to the accompanying drawings, in which.

DETAILED DESCRIPTION OF THE INVENTION

Figure 1:
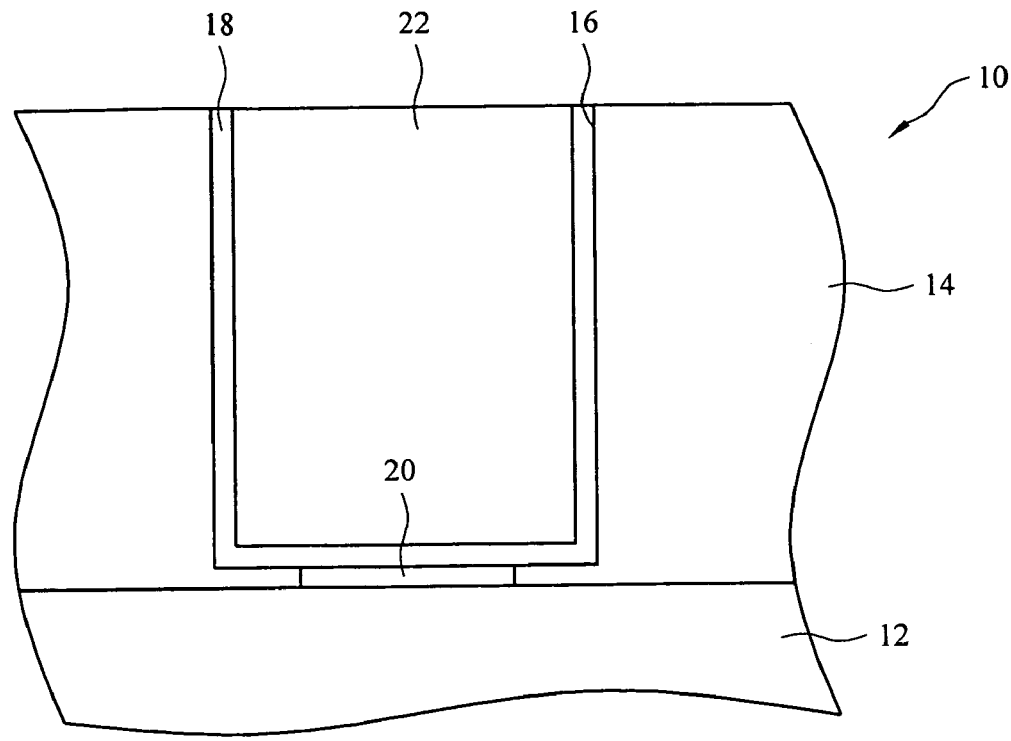
FIG. 1 is a cross-section of a conventional damascene structure having a fluorinated silicate glass (FSG) layer as an intermetal dielectric layer.

The present invention contemplates a novel in-situ method for enhancing stability of an FSG layer after the FSG layer is formed on a substrate. The in-situ method is carried out typically in a CVD chamber and includes depositing the FSG layer on the substrate and exposing the FSG layer to phosphine ($PH_3$) after the FSG deposition process. The phosphine is typically introduced into the CVD chamber with an oxygen-containing gas such as nitrous oxide ($N_2O$). An oxidation/reduction reaction takes place in which reactive hydrogen species from the phosphine combine with free fluorine radicals in the chamber to form hydrogen fluoride (HF) gas and reactive phosphorous species from the phosphine combine with oxygen to form a phosphorous oxide PSG (phosphosilicate glass) film on the exposed surfaces of the FSG layer. The PSG film forms a moisture-gettering and ion-gettering medium which absorbs and prevents fluoride-based radicals from penetrating and damaging the FSG layer. The hydrogen fluoride is evacuated from the chamber through the conventional chamber vacuum pump. Accordingly, the fluorine radical content of the chamber is eliminated or substantially reduced, thus stabilizing the FSG layer. The PSG film may remain on the surface of the FSG layer to promote adhesion of higher-order layers such as SiN or SiON films to the FSG layer, or may act as a stress adjustment layer.

One possible mechanism by which a reactive hydrogen species from the phosphine ($PH_3$) neutralizes an SiF* radical involves the formation of water by the combination of phosphine with nitrous oxide and the combination of water with the SiF* radical to form HF and SiOH according to the following equation:

The SiOH then reacts with an additional SiF* radical to form additional HF and an Si—O—Si bond according to the following equation:

SiOH+SiF*------>HF+Si—O—Si

The present invention further contemplates an ex-situ method for stabilizing an FSG layer after an etching process. According to the method, an FSG layer is provided on a substrate. A via opening is etched in the FSG layer typically using a fluorine-containing compound such as $CF_4$, $C_3F_6$, $C_5F_8$, followed by cleaning of the PSG layer using a fluoride-based solvent cleaning compound. After the solvent-cleaning step, the exposed top, sidewall and bottom surfaces of the FSG layer are exposed to $PH_3$ and $N_2O$ to form fluoride radical-removing hydrogen species and a moisture- and ion-guttering PSG film on the exposed FSG layer.

In still another embodiment, the method is an ex-situ method for stabilizing an FSG layer after a CMP process. According to the method, a metal via is etched in an FSG layer deposited on a substrate. The metal via is subjected to chemical mechanical planarization (CMP), such that the upper surface of the FSG layer is exposed. The exposed FSG layer is subjected to $PH_3$ and $N_2O$ to form fluoride radical-removing hydrogen species and a moisture- and ion-guttering PSG film on the exposed FSG layer.

Figure 2A:
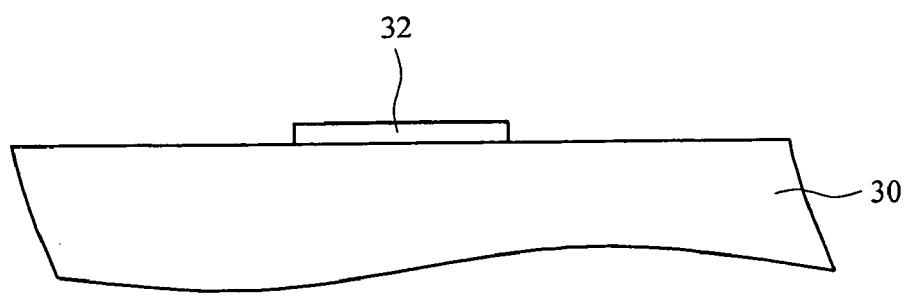
FIGS. 2A–2C are cross-sectional views illustrating deposition of an FSG layer on a substrate and exposure of the FSG layer to $PH_3$ according to an in-situ method for enhancing FSG film stability of the present invention.
Figure 2B:
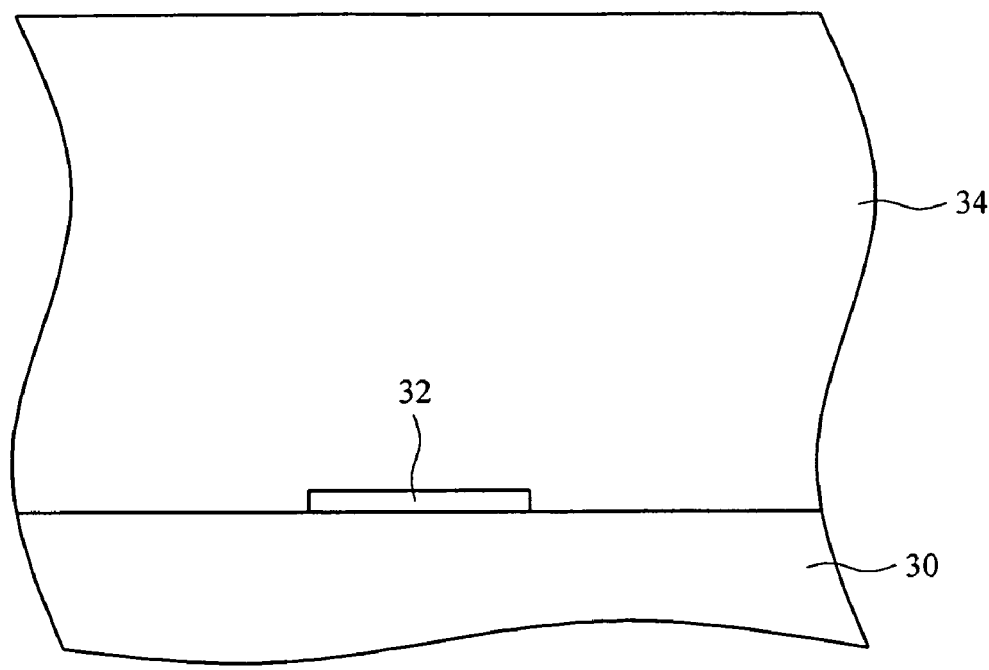
Figure 2C:
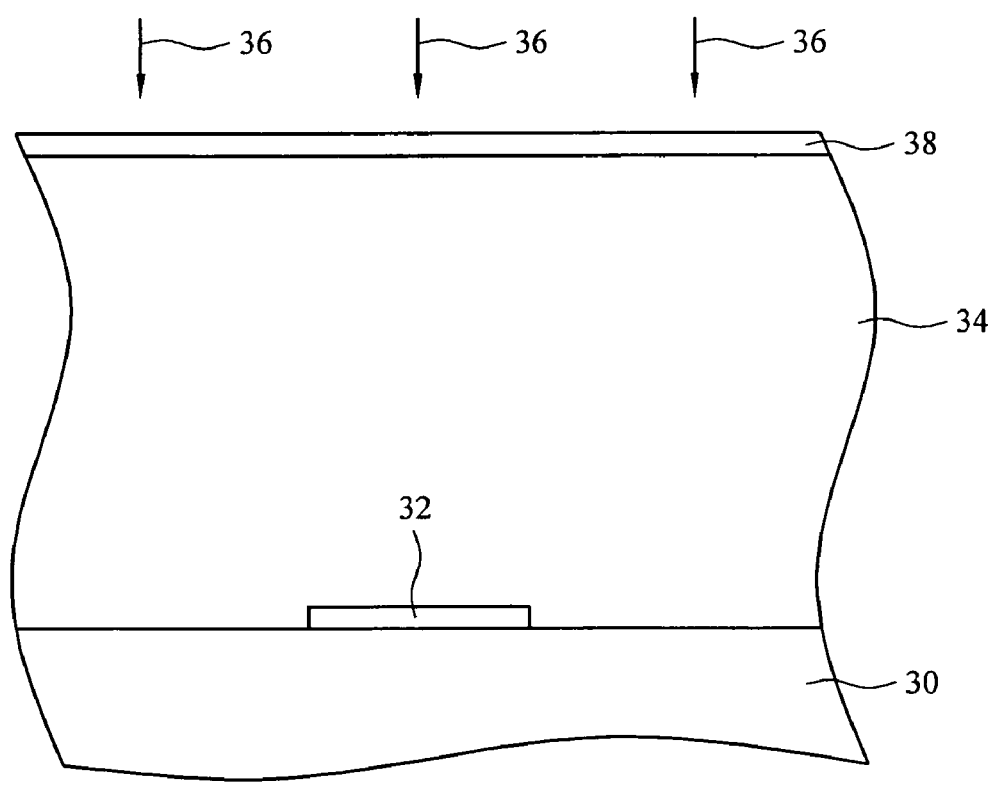

Referring to FIGS. 2A–2C, in the fabrication of semiconductor integrated circuit devices on a typically silicon substrate 30, a metal line 32 which electrically connects adjacent devices (not shown) on the substrate 30 is typically initially formed. This may be carried out using conventional CVD (chemical vapor deposition), photolithography and etching processes known to those skilled in the art. According to the in-situ method for enhancing FSG film stability of the present invention, an FSG layer 34 is deposited on the substrate 30, as shown in FIG. 2B, and will ultimately serve as an intermetal dielectric (IMD) layer between the metal line 32 and higher-order wiring structures (not shown) to be subsequently fabricated on the FSG layer 34. As shown in FIG. 2C, immediately after deposition of the FSG layer 34 on the substrate 30 and metal line 32 is completed, the FSG layer 34 is exposed to a phosphorous- and hydrogen-containing gas 36, which is introduced into the CVD process chamber. Preferably, the gas 36 is phosphine ($PH_3$) and nitrous oxide ($N_2O$). Alternatively, it is understood that other phosphorous-containing gases, such as tri-methyl phosphate, for example, may be introduced into the process chamber along with a hydrogen-containing gas such as ammonia ($NH_3$) or hydrogen gas ($H_2$), for example.

After deposition of the FSG layer 34, reactive fluorine radical compounds remain in the process chamber. These compounds typically include, in descending order of reactivity, $F^* > SiF^* > SiF_2 > SiF_3$. Accordingly, the phosphine is ionized to form reactive phosphate species and reactive hydrogen species. The reactive hydrogen species combines with the free fluorine radicals to form hydrogen fluoride (HF) gas, which is evacuated from the process chamber. Reactive hydrogen species also react with the fluorine radicals in the SiF*, $SiF_2$ and $SiF_3$ to form additional HF gas and $Si_2O$, which are evacuated from the chamber. The reactive phosphorous species reacts with oxygen to form a phosphorous oxide PSG film 38 on the surface of the FSG layer 34. The PSG film 38 preferably has a thickness of typically about 100~500 angstroms and acts as a moisture- and ion-gettering medium which prevents moisture and mobile ions from penetrating the FSG layer 34. Accordingly, the fluorine radical-neutralizing reactive hydrogen species and the moisture- and ion-gettering PSG film 38 stabilize and prevent or substantially reduce radical-induced damage to the FSG layer 34.

Figure 5:
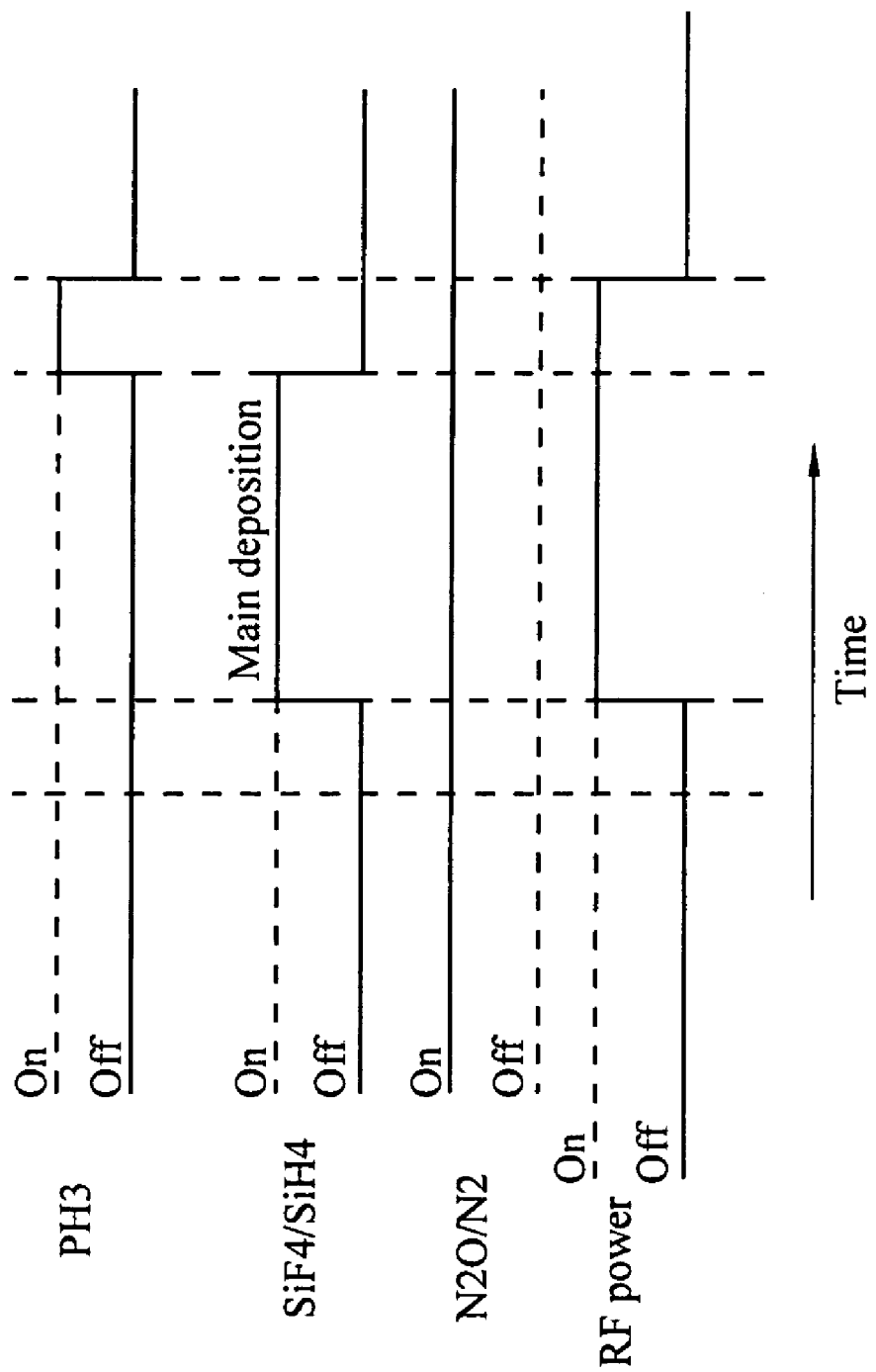
FIG. 5 is a process time chart wherein timing of RF power application, reactant gas flow and $PH_3$ application in an FSG layer formation process are shown relative to each other according to an in-situ method for enhancing FSG film stability of the present invention.

A process time chart depicting RF power application and gas flow according to an in-situ method for enhancing FSG film stability according to the present invention is shown in FIG. 5. Accordingly, chamber RF power is initially off as a gas mixture of $N_2O/N_2$ is initially introduced into the chamber. The $N_2O$ is an oxidizer, whereas the $N_2$ serves as a carrier for the $N_2O$. This flow of $N_2O/N_2$ into the chamber is typically continued throughout the entire deposition process. To begin deposition of the FSG layer 34 onto the substrate 30 (at the "main deposition" stage on the chart), the precursor gases for the FSG layer 34, $SiF_4$ and $SiH_4$, are introduced into the process chamber as a $SiF_4/SiH_4$ gas mixture. Simultaneously, the chamber RF power is turned on, thereby forming a reactive plasma from the $SiF_4/SiH_4$ precursor gas mixture in the chamber.

As further shown in FIG. 5, after the main deposition stage of forming the PSG film 38 on the FSG layer 34 is completed, further flow of the $SiF_4/SiH_4$ precursor gas mixture into the chamber is stopped. However, the RF power remains on for a short time after the deposition process. Accordingly, ionization of the $SiF_4/SiH_4$ precursor gas mixture in the chamber continues, forming the reactive fluorine species. Therefore, the $PH_3$ is introduced into the chamber from the time the main deposition stage is completed until the RF power in the chamber is turned off. At that point, the $PH_3$ is ionized to form the reactive hydrogen species which combines with scavenging the residual fluoride radicals to form hydrogen fluoride and to form the reactive phosphorous species which combines with oxygen to form the PSG film 38 on the FSG layer 34. The hydrogen fluoride gas is evacuated from the chamber using the chamber exhaust pump, in conventional fashion. Additional steps may then be carried out to form a damascene structure (not shown), for example, having a via opening (not shown) etched in the FSG layer 34 and a metal inlay (not shown) deposited in the via opening.

Typical process conditions for formation of the FSG layer 34, as well as formation of the PSG film 38 and neutralization of the reactive fluorine radicals according to the in-situ method of the present invention, include an RF power of typically about 100 to 3000 watts; an $N_2O/N_2$ flow rate of typically about 100 to 10000 sccm; a $SiF_4/SiH_4$ flow rate of typically about 100 to 1000 sccm; and a $PH_3$ flow rate of typically about 100 to 1000 sccm.

Figure 3A:
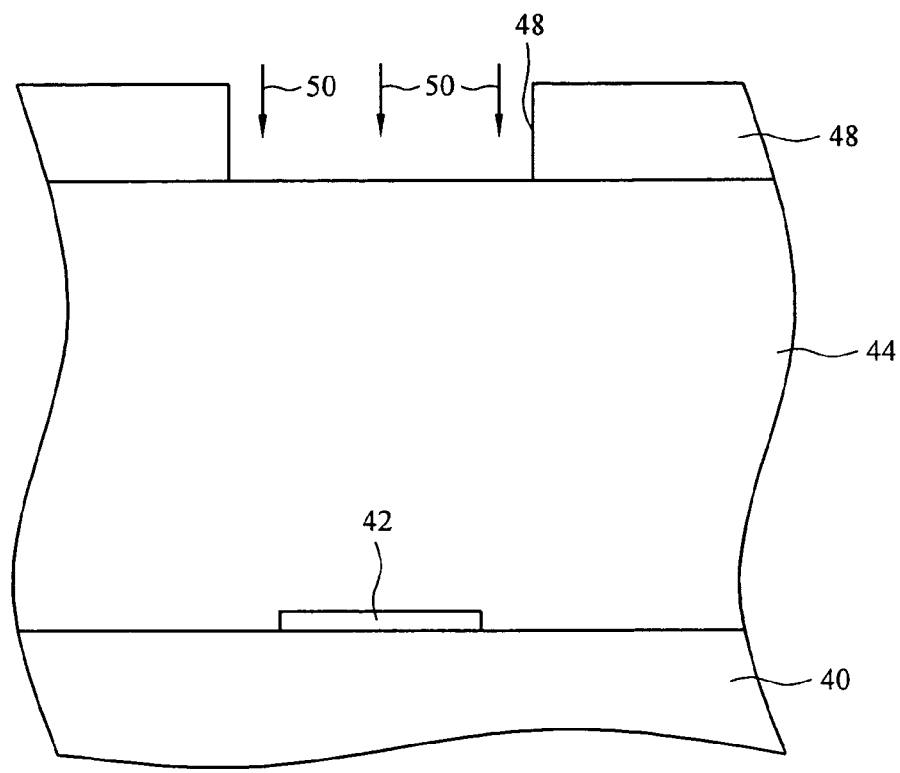
FIGS. 3A and 3B are cross-sectional views illustrating etching of a via opening in an FSG layer followed by exposure of the FSG layer to $PH_3$ according to an ex-situ method for enhancing FSG film stability of the present invention.
Figure 3B:
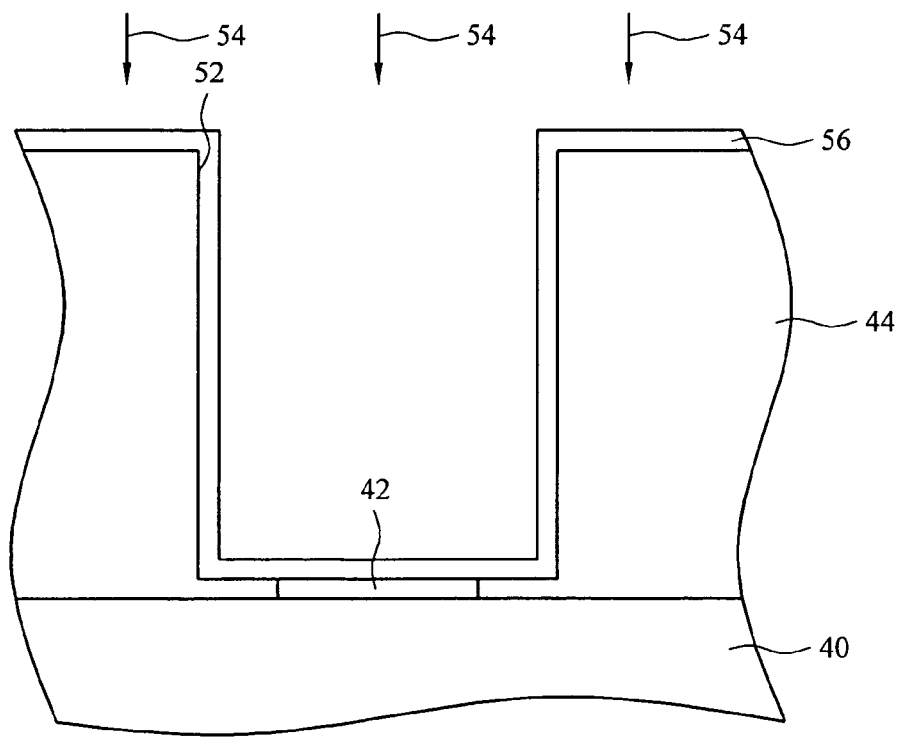

Referring next to FIGS. 3A and 3B, an ex-situ method for enhancing FSG film stability according to the present invention may be preceded by deposition of an FSG layer 44 on a substrate 40, typically having a metal line 42 thereon. The FSG layer 44 may be deposited on the substrate 40 according to conventional methods or according to the method heretofore described with respect to FIGS. 2A–2C and FIG. 5. Preparatory to etching a via opening 52 (FIG. 3B) in the FSG layer 44, a photoresist layer or mask 46 having a mask opening 48 is formed on the FSG layer 44 typically using conventional photolithography techniques known to those skilled in the art. An etchant 50, which may be a fluorine-containing compound such as $CF_4$, $C_3F_6$, $C_5F_8$, for example, is then applied to the FSG layer 44 through the mask opening 48 to form the via opening 52 in the FSG layer 44, typically in conventional fashion. This is followed by cleaning the exposed surfaces of the PSG layer 44 using a fluoride-based solvent cleaning compound (not shown) to remove residual etchant particles (not shown) from the PSG layer 44.

According to the ex-situ method of the present invention, a phosphorous- and hydrogen-containing gas 54, which is preferably phosphine ($PH_3$) but may be alternative phosphorous-containing and hydrogen-containing gases, is applied to the sidewalls and bottom surface of the via opening 52, as well as the upper surface of the FSG layer 44. This step may be carried out in a conventional CVD process chamber (not shown). The gas 54 is preferably introduced into the process chamber with a $N_2O/N_2$ gas mixture. Accordingly, the gas 54 is ionized to form the reactive hydrogen species which combine with the residual fluoride radicals remaining on the surfaces of the FSG layer 44 to form hydrogen fluoride and to form the reactive phosphorous species which combines with oxygen to form a PSG film 56 on the exposed surfaces of the FSG layer 44. The PSG film 56 preferably has a thickness of typically about 100–500 angstroms. The hydrogen fluoride gas is evacuated from the chamber using the chamber exhaust pump. Additional steps may then be carried out to form a damascene structure (not shown), for example, having a metal inlay (not shown) deposited in the via opening 52.

Typical process conditions for formation of the PSG film 56 and neutralization of the reactive fluorine radicals according to the ex-situ method of the present invention include an RF power of typically about 100 to 3000 watts; an $N_2O/N_2$ flow rate of typically about 100 to 10000 sccm; and a $PH_3$ flow rate of typically about 100 to 1000 sccm.

Figure 4A:
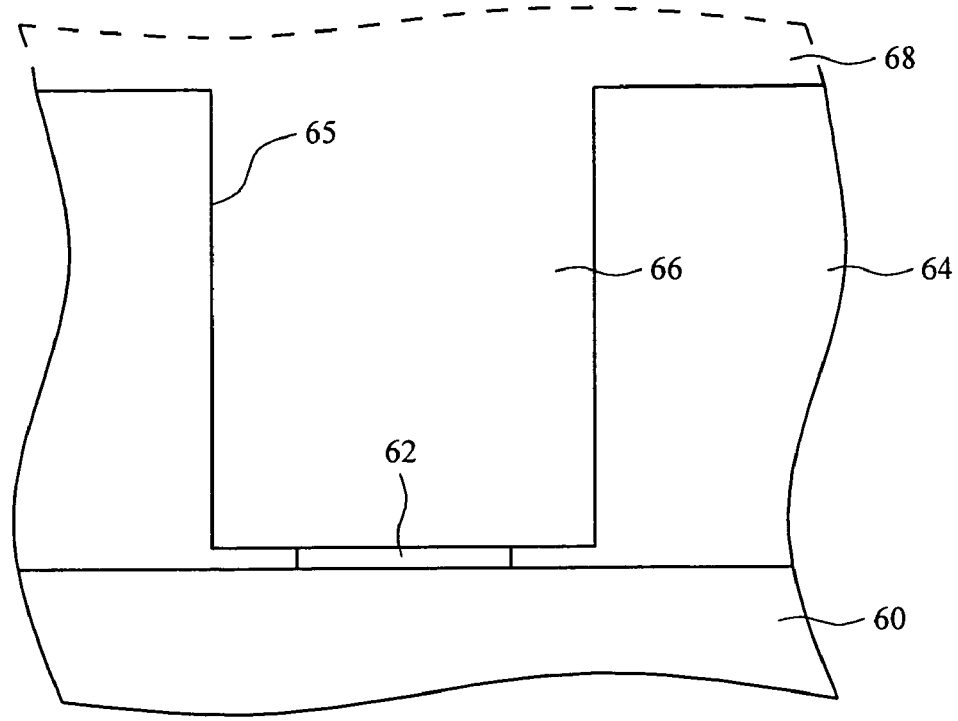
FIGS. 4A and 4B are cross-sectional views illustrating subjecting a metal inlay to CMP (chemical mechanical planarization) followed by exposure of an intermetal dielectric FSG layer to $PH_3$ according to an ex-situ method for enhancing FSG film stability of the present invention.
Figure 4B:
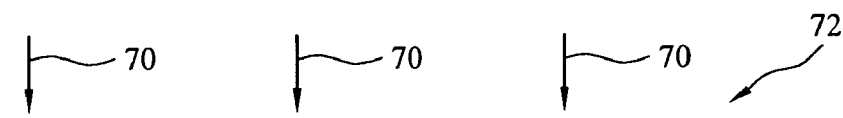
Figure 4B:
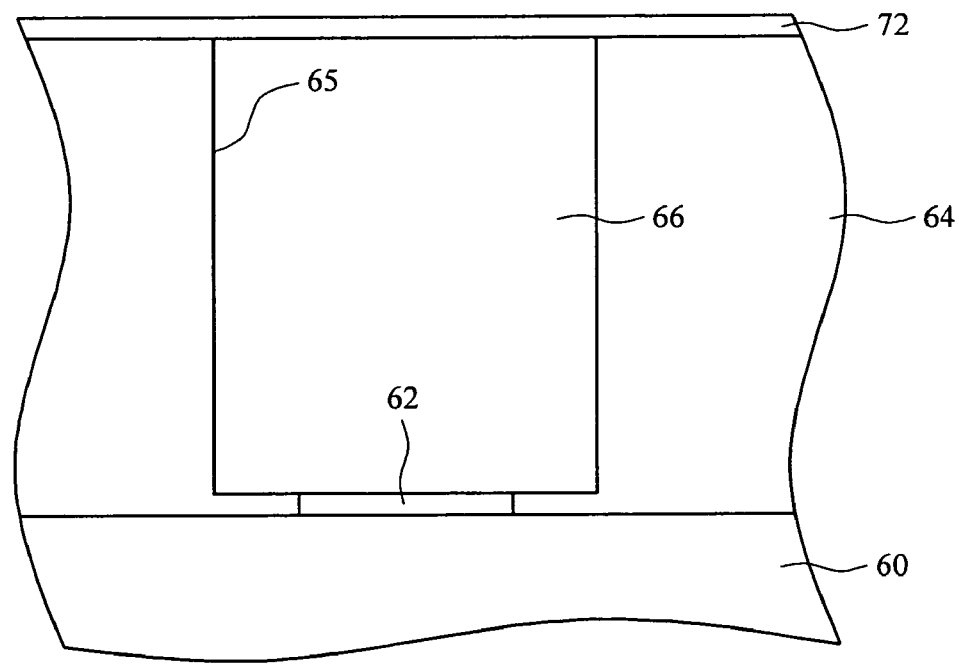

Referring next to FIGS. 4A and 4B, another ex-situ method for enhancing FSG film stability according to the present invention may be preceded by formation of a via opening 65 in an FSG layer 64 deposited on a substrate 60. The via opening 65 may communicate with a metal line 62 previously formed on the substrate 60. The FSG layer 64 may be formed using conventional methods or the deposition method heretofore described with respect to FIGS. 2A–2C and FIG. 5. Moreover, the via opening 65 may be formed using conventional methods or the method heretofore described with respect to FIGS. 3A and 3B. A metal inlay 66, which is typically copper, is deposited in the via opening 65 typically using conventional electrochemical plating techniques according to the knowledge of those skilled in the art. After the deposition process, a metal overburden 68 is removed from the upper surface of the FSG layer 64 typically using a conventional chemical mechanical planarization (CMP) process. This step exposes the upper surface of the FSG layer 64, requiring the removal of reactive fluorine radicals and fluorine radical-containing compounds from the exposed surface of the FSG layer 64.

Therefore, in the ex-situ method of the present invention, a phosphorous- and hydrogen-containing gas 70, which is preferably phosphine ($PH_3$) but may be alternative phosphorous-containing and hydrogen-containing gases, is applied to the exposed upper surface of the FSG layer 64. This step may be carried out in a conventional CVD process chamber (not shown). The gas 70 is preferably introduced into the process chamber along with a $N_2O/N_2$ gas mixture. The gas 70 is ionized to form the reactive hydrogen species which combine with the residual fluoride radicals remaining on the surfaces of the FSG layer 64 to form hydrogen fluoride and to form the reactive phosphorous species which combines with oxygen to form a PSG film 72, which preferably has a thickness of typically about 100–200 angstroms, on the exposed surfaces of the FSG layer 64. The hydrogen fluoride gas is evacuated from the chamber using the chamber exhaust pump. Additional steps may then be carried out to complete a damascene structure 74 of which the metal inlay 66 forms a part.

Typical process conditions for formation of the PSG film 72 and neutralization of the reactive fluorine radicals according to the ex-situ method of the present invention include an RF power of typically about 100 to 3000 watts; an $N_2O/N_2$ flow rate of typically about 100 to 10000 sccm; and a $PH_3$ flow rate of typically about 100 to 1000 sccm.

Figure 6:
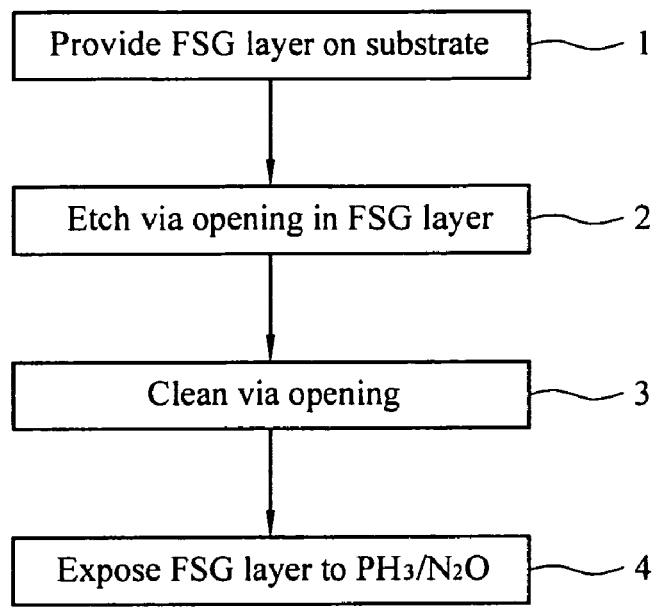
FIG. 6 is a flow diagram which summarizes sequential process steps carried out according to a post-etch ex-situ method for enhancing FSG film stability of the present invention.

A flow diagram which summarizes sequential process steps carried out according to a first embodiment of the ex-situ method for enhancing FSG film stability according to the present invention is shown in FIG. 6. In step 1, an FSG layer is provided on a substrate. In step 2, a via opening is etched in the FSG layer. In step 3, the via opening is cleaned, typically using fluorine-based solvents. In step 4, the FSG layer is exposed to a phosphorous- and hydrogen-containing gas, preferably $PH_3$ and $N_2O$.

Figure 7:
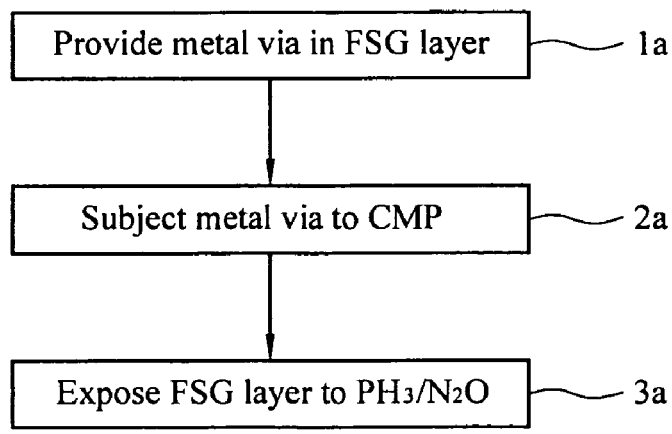
FIG. 7 is a flow diagram which summarizes sequential process steps carried out according to a post-CMP ex-situ method for enhancing FSG film stability of the present invention.

FIG. 7 illustrates a flow diagram which summarizes sequential process steps carried out according to a second embodiment of the ex-situ method for enhancing FSG film stability according to the present invention. In step 1a, a metal via is provided in an FSG layer provided on a substrate. In step 2a, the metal via is subjected to CMP to remove metal overburden from the via. In step 3a, the FSG layer is exposed to a phosphorous- and hydrogen-containing gas, preferably $PH_3$ and $N_2O$.

While the preferred embodiments of the invention have been described above, it will be recognized and understood that various modifications can be made in the invention and the appended claims are intended to cover all such modifications which may fall within the spirit and scope of the invention.

What is claimed is:

1. An in-situ method for enhancing stability of a fluorinated silicon glass layer, comprising:
    providing a substrate;
    forming a fluorinated silicon glass layer on said substrate;
    providing a phosphorous-containing and hydrogen-containing gas; and
    removing reactive fluorine species from said layer and forming a phosphorious oxide film on said layer by exposing said layer to said phosphorous-containing and hydrogen-containing gas.

2. The method of claim 1 wherein said phosphorous-containing and hydrogen-containing gas comprises phosphine.

3. The method of claim 1 further comprising providing an oxidizing compound and exposing said fluorinated silicon glass layer to said oxidizing compound.

4. The method of claim 3 wherein said oxidizing compound comprises nitrous oxide, oxygen, ozone.

5. The method of claim 1 further comprising fabricating a damascene structure in said layer.

6. The method of claim 1 wherein said phosphorous-containing and hydrogen-containing gas comprises trimethyl phosphate.

7. The method of claim 1 wherein said phosphorous oxide film has a thickness of from about 100 to about 500 angstroms.

8. The method of claim 1 wherein said substrate comprises silicon.

9. An ex-situ method for enhancing stability of a fluorinated silicon glass layer, comprising:
    providing a substrate having a fluorinated silicon glass layer on said substrate;
    etching a via opening in said layer;
    providing a phosphorous-containing and hydrogen-containing gas; and removing reactive fluorine species from said layer and forming a phosphorious oxide film on said layer by exposing said layer to said phosphorous-containing and hydrogen-containing gas.

10. The method of claim 9 wherein said phosphorous-containing and hydrogen-containing gas comprises phosphine.

11. The method of claim 9 further comprising providing an oxidizing compound and exposing said fluorinated silicon glass layer to said oxidizing compound.

12. The method of claim 11 wherein said oxidizing compound comprises nitrous oxide, oxygen, ozone.

13. The method of claim 9 further comprising providing a fluorine-containing solvent and applying said solvent to said layer after said etching a via opening in said layer.

14. The method of claim 9 wherein said phosphorous-containing and hydrogen-containing gas comprises trimethyl phosphate.

15. The method of claim 9 wherein said phosphorous oxide film has a thickness of from about 100 to about 500 angstroms.

16. The method of claim 9 wherein said substrate comprises silicon.

17. An ex-situ method for enhancing stability of a fluorinated silicon glass layer, comprising:
providing a substrate having a fluorinated silicon glass layer on said substrate, a via opening in said layer and a metal inlay in said via opening;
planarizing said metal inlay;
providing a phosphorous-containing and hydrogen-containing gas; and
removing reactive fluorine species from said layer and forming a phosphorious oxide film on said layer by exposing said layer to said phosphorous-containing and hydrogen-containing gas.

18. The method of claim 17 wherein said phosphorous-containing and hydrogen-containing gas is a gas selected from the group consisting of phosphine and trimethyl phosphate.

19. The method of claim 17 further comprising providing an oxidizing compound and exposing said fluorinated silicon glass layer to said oxidizing compound.

20. The method of claim 17 wherein said phosphorous oxide film has a thickness of from about 100 to about 500 angstroms.

21. A stabilized fluorinated silicon glass layer comprising a phosphorous oxide film provided on said layer, said phosphorous oxide film formed by providing a phosphorous-containing and hydrogen-containing gas and exposing said layer to said gas.

22. The stabilized fluorinated silicon glass layer of claim 21 wherein said phosphorous oxide film has a thickness of from about 100 to about 500 angstroms.

23. The stabilized fluorinated silicon glass layer of claim 21 wherein said phosphorous-containing and hydrogen-containing gas is a gas selected from the group consisting of phosphine and trimethyl phosphate.

* * * * *